United States Patent [19]

Toyooka et al.

[11] Patent Number: 4,538,242
[45] Date of Patent: Aug. 27, 1985

[54] SIGNAL PROCESSING CIRCUIT FOR MAGNETIC BUBBLE MEMORY DEVICES

[76] Inventors: Takashi Toyooka, 3-14-301, Tsutsujino, 259-1, Kamihirosi, Samama-shi, Saitama-ken; Aoki Hirokazu, 1-48-18, Akatsuki-machi, Hachiouji-shi, Tokyo; Mamoru Sugie, 25-18-710, Unoki, Sayama-shi, Saitama-ken; Yutaka Sugita, 5-12-1, Nakaarai, Tokorozawa-shi, Saitama-ken, all of Japan

[21] Appl. No.: 511,334

[22] Filed: Jul. 6, 1983

[30] Foreign Application Priority Data
Jul. 9, 1982 [JP] Japan ................................. 57-118554

[51] Int. Cl.³ .......................................... G11C 19/08
[52] U.S. Cl. .................................................... 365/8
[58] Field of Search ......................................... 365/8

[56] References Cited

U.S. PATENT DOCUMENTS 4,179,750 12/1979 Quadri ..................................... 365/8
4,318,186 3/1982 Wynn ..................................... 365/8

OTHER PUBLICATIONS

IEEE Transactions on Magnetics, vol. 12, No. 6, pp. 614–617, (1976).
AIP Conference Proceedings No. 24, p. 547, "Some Aspects of Permalloy Chevron Strip Detector".
Japanese Preliminary Patent Publication No. 48-13039.

Primary Examiner—James W. Moffitt
Attorney, Agent, or Firm—Charles E. Pfund

[57] ABSTRACT

A signal processing circuit for a magnetic bubble memory device is arranged to set a reference level for determining the level of "1" or "0" of the bubble sensing line signal during a period in which only a read signal corresponding to level "0" appears as the output signal of a differential amplifier of the bubble detector circuit.

3 Claims, 8 Drawing Figures

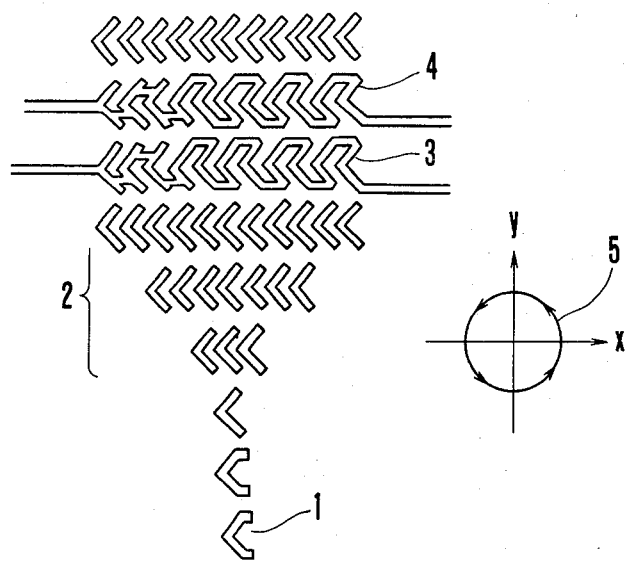
F I G. 1
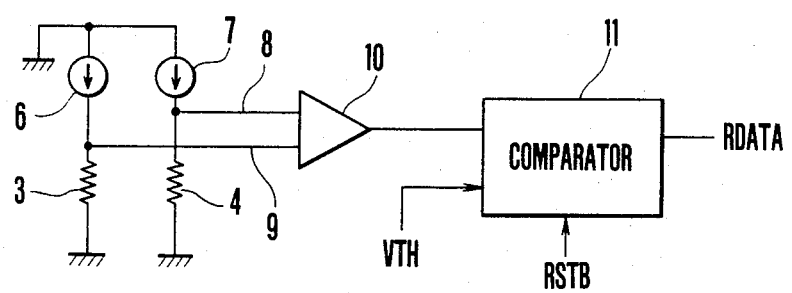
PRIOR ART  F I G. 2

SIGNAL PROCESSING CIRCUIT FOR MAGNETIC BUBBLE MEMORY DEVICES

BACKGROUND OF THE INVENTION

1. Field of the Invention

The present invention relates to a signal processing circuit for processing a detection signal from a bubble memory chip and more particularly, to a signal processing circuit for detecting a detection signal whose level "0" changes in accordance with changes in ambient temperature and in a rotating magnetic field.

2. Description of the Prior Art

In magnetic bubble memory devices, a rotating magnetic field 5 of 40 to 60 Oe, rotating in the major surface of the device, is applied to a propagation path so as to propagate bubbles having a diameter of 0.5 to 4 m. The propagation path has permalloy elements 1 of a configuration as shown in FIG. 1. In order for the bubble to stably exist, a DC bias magnetic field of 100 to 600 Oe must be applied in a direction perpendicular to a magnetic film surface. For storage of information, the presence of a bubble can represent information "1", while the absence thereof can represent information "0". A typical example of a magnetic bubble memory device of this type is described in IEEE TRANSACTIONS ON MAGNETICS, Vol 12, No. 6, pp. 614–617 (1976). In this memory device, a bubble detector comprises an expander 2 which includes a plurality of chevron propagation paths arranged in y direction and each having a plurality of chevron elements arranged in x direction, and sensing lines 3 and 4 each having a plurality of chevron elements, like the expander 2, which are electrically connected by permalloy bars in the x direction. The bubbles propagate along the propagation path in the y direction under the application of the rotating magnetic field 5 and are expanded by the expander 2 in the x direction. The expanded bubbles change the magnetized state of the sensing lines 3 and 4 when they pass under the sensing lines 3 and 4. More particularly, since the sensing lines 3 and 4 are made of permalloy, like the propagation path, these sensing lines 3 and 4 change their resistance owing to the magnetoresistance effect of permalloy. This change is detected as a voltage signal across each of the sensing lines 3 and 4 when constant currents are fed to the lines 3 and 4 from DC constant current sources 6 and 7 respectively connected to the sensing lines 3 and 4 as shown in FIG. 2.

The resistances of the sensing lines have noise components which change in accordance with the rotating magnetic field for driving the bubbles. The noise components change at a frequency which is twice the frequency of the rotating magnetic field. Lines 8 and 9 connected with the sensing lines 3 and 4 are affected by electrostatic and electromagnetic induction noise components generated from a coil for generating the rotating magnetic field. In order to eliminate these noise components, signals on the sensing lines 3 and 4 are supplied to a differential amplifier 10 through the lines 9 and 8. The differential amplifier 10 detects a difference between these signals and amplifies the difference by 10 to 100 times. An output signal from the differential amplifier 10 has a waveform 12 shown in FIG. 3a when a bubble is present. However, the output signal has a waveform 13 in FIG. 3a when no bubble is present. The output signal from the differential amplifier 10 is supplied to a comparator 11. The comparator 11 compares this signal with a threshold level (VTH) 15 in response to a read strobe (RSTB) 14.

The detection signal changes in accordance with changes in amplitude of the rotating magnetic field and ambient temperature. This signal also varies in accordance with irregularity of the chip manufacturing process conditions. Furthermore, the electrostatic and electromagnetic noise components from the coil for generating the rotating magnetic field differ from module to module. Therefore, the level of the output signal from the differential amplifier 10 changes as shown in FIGS. 3b and 3c wherein signals 17 and 19 correspond to level "0" signals, respectively, and signals 16 and 18 correspond to level "1" signals, respectively. These changes in signal level are also influenced by changes in temperature characteristics of the differential amplifier circuit and power supply voltage. In connection with FIGS. 3b and 3c, when the threshold level is fixed at a level 15 shown in FIG. 3a, erroneous operation occurs. In order to avoid this problem, the threshold level in FIG. 3b must be set at a level 20, and the threshold level in FIG. 3c must be set at a level 21.

SUMMARY OF THE INVENTION

It is an object of the present invention to provide a signal processig circuit for magnetic bubble memory devices capable of eliminating errors in magnetic bubble detection signals. To this end, a threshold level is set corresponding to a change in level of a detected output signal.

According to one aspect of the present invention, there is provided a signal processing circuit for a magnetic bubble memory device having two bubble sensing elements comprising:

a differential amplifier, connected to the two bubble sensing elements, for amplifying a difference between output signals from the two bubble sensing elements;

a comparator, connected to the differential amplifier, for comparing an output signal from the differential amplifier with a given reference level; and reference level determining means, connected to the comparator, for changing the reference level during a period in which absence of a bubble is detected by the bubble sensing elements until the output of the comparator changes at a first reference level and for determining a second reference level for bubble read operation on the basis of the first reference level.

According to another aspect of the present invention, there is provided a signal processing circuit for a magnetic bubble memory device having two pulse driven type sensing elements, comprising:

a differential amplifier, connected to said two bubble sensing elements, for amplifying a difference between output signals from said two bubble sensing elements;

a comparator, connected to said differential amplifier, for comparing an output signal from said differential amplifier with a predetermined reference level; and reference level determining means, connected to said comparator, for producing a reference level supplied to one of said sensing elements and changing the reference level during a period in which absence of a bubble is detected by the bubble sensing elements until the output of the comparator changes at a first reference level and for determining a second level for bubble read operation on the basis of the first reference level.

The present invention is based on the fact that all factors responsible for level variation have time constants of several seconds or more. Therefore, according to the present invention, a circuit is arranged to set a reference level for determining the level "1" or "0" of the sensing line signal during a period in which only a read signal corresponding to level "0" appears as the output signal from the differential amplifier, thereby eliminating the conventional drawback.

BRIEF DESCRIPTION OF THE DRAWINGS

FIG. 1 shows bubble sensing lines associated with a bubble propagation path;

FIG. 2 is a block diagram of a conventional bubble detection circuit;

DETAILED DESCRIPTION OF THE PREFERRED EMBODIMENTS

Preferred embodiments of the present invention will be described with reference to the accompanying drawings.

Figure 4:
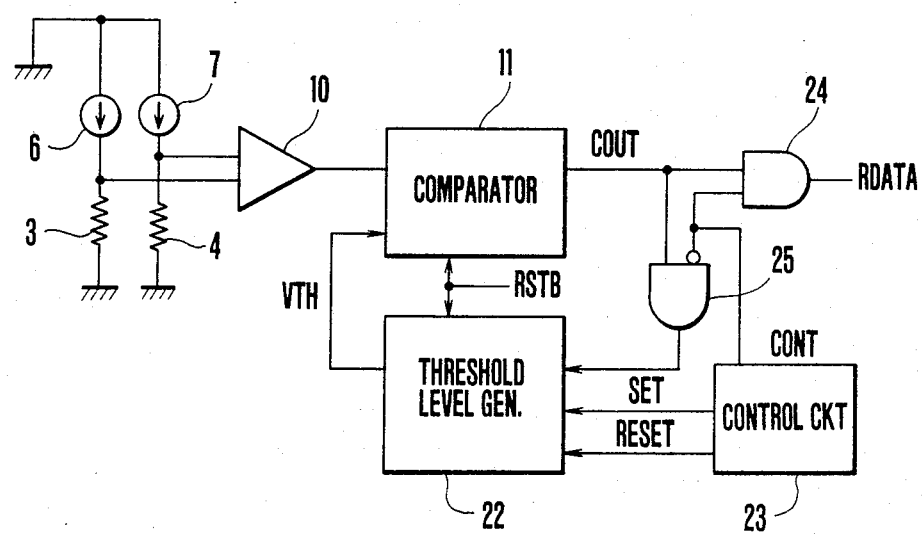
FIG. 4 is a block diagram of a signal processing circuit according to an embodiment of the present invention.

In a signal processing circuit according to a first embodiment of the present invention as shown in FIG. 4, sensing lines 3 and 4, constant current sources 6 and 7, a differential amplifier 10 and a comparator 11 are the same as those in the conventional circuit shown in FIG. 2. A threshold level voltage generator 22 controls a threshold level signal in accordance with an output signal from the comparator 11. More specifically, the threshold level voltage generator 22 performs setting of a threshold level signal for a time interval during which only a read signal of level "0" is generated, that is, no bubble passes by the sensing lines. The threshold level voltage generator 22 keeps the threshold level at a predetermined level for a time interval during which a signal of level "1" is generated by a series of bubbles representative of data. A control circuit 23 controls the threshold level voltage generator 22 and AND gates 24 and 25 in accordance with whether the time interval during which only the read signal of level "0" is generated prevails or the time interval during which a signal of level "1" is generated by the bubble string representative of the data prevails.

Figure 5:
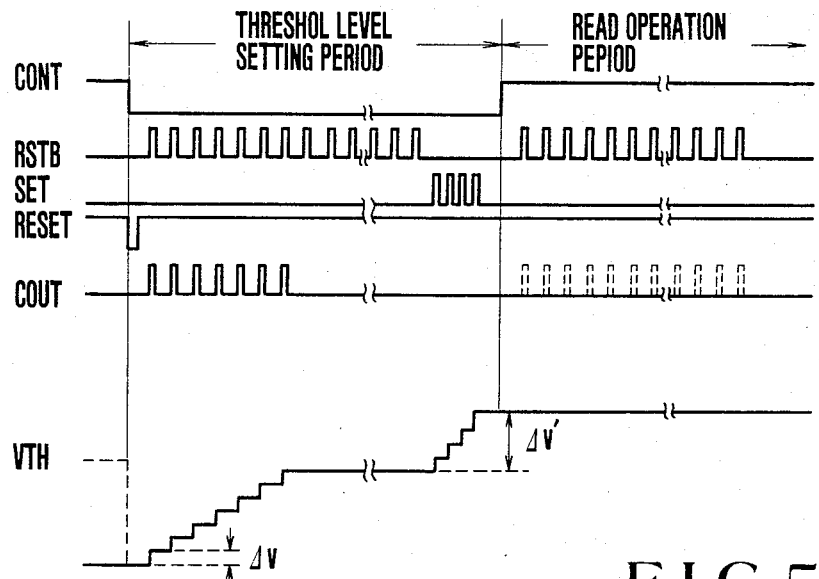
FIG. 5 is a timing chart for explaining the operation of the circuit shown in FIG. 4.

The operation of the circuit shown in FIG. 4 will now be described in detail with reference to FIG. 5. An output CONT from the control circuit 23 is set at low "L" level at the initiation of threshold level setting. At the same time, an output RESET from the control circuit 23 is supplied to the threshold level voltage generator 22. As a result, the threshold level VTH from the threshold level voltage generator 22 is set at an initial value (the lowest level). This initial value depends on changes in ambient temperature and power supply voltage and is set to be below a minimum level of an output signal from the differential amplifier 10 which corresponds to the read signal of level "0". Therefore, at this level of threshold, an output COUT from the comparator 11 assumes high "H" level without fail. The high level output COUT is supplied to the threshold level voltage generator 22 through the AND gate 25. The threshold level voltage generator 22 then boosts the threshold level VTH by a predetermined difference $\Delta v$ in response to a strobe pulse RSTB and accordingly the signal COUT from the comparator 11. The above-mentioned operation is repeated for each updated threshold level VTH. After performing this operation a plurality of times, the latest threshold level VTH becomes greater than the read signal of level "0" from the comparator 10. This state is obtained at the end of the eighth boosting operation (the initial value of the threshold level VTH is boosted by $7 \times \Delta v$) in FIG. 5.

Thereafter, since the output COUT is no longer generated by the comparator 11, the present threshold level VTH is kept constant. At the end of threshold level setting period, a set pulse SET is supplied from the control circuit 23 to the threshold level voltage generator 22. A single set pulse or a plurality of set pulses may be generted by the control circuit 23 for the formation of the set pulse in accordance with a given circuit configuration thereof. The set pulse SET is used to increase the threshold level VTH from the threshold level voltage generator 22 by a required amount (i.e., a difference $\Delta v'$). The difference $\Delta v'$ is preset within a range between 20% and 80% of a difference between the read signal of level "0" and the read signal of level "1" of the output signal from the differential amplifier 10. The difference $\Delta v'$ is preset in accordance with the characteristics of the signal on the detection line. The threshold level VTH set through the above operation is kept and the subsequent read operation is carried out. During the read operation period, substantially the same operation as that of the conventional detector circuit shown in FIG. 2 is carried out. Namely, the output signal from the differential amplifier 10 is compared with the threshold level VTH in response to a read strobe RSTB so as to produce read data RDATA. During this operation, the output CONT is kept high to keep the gate 24 enabled.

Figures 3A, 3B, 3C:
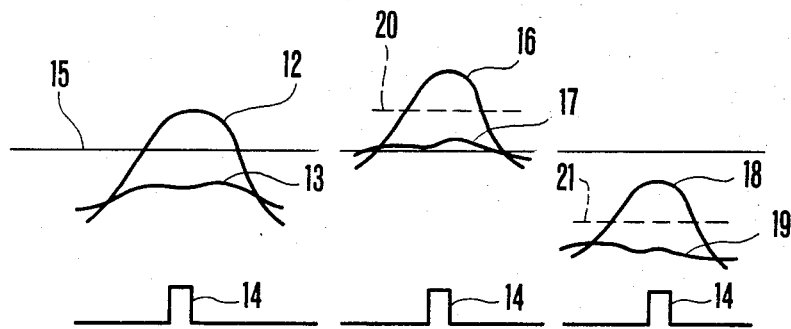
FIGS. 3a to 3c show variations of detection output signal due to changes in temperature and power supply voltage.

As will be apparent from the above description, the threshold level can be preset at an optimized value corresponding to the read signal of level "0" immediately before the read operation period. Consequently, it is possible to prevent a decrease in threshold level margin caused by changes in output from the differential amplifier 10 as shown in FIGS. 3b and 3c due to such variation factors for the read signal level of a time constant of more than second as changes in the ambient temperature and power supply voltage.

Figure 6:
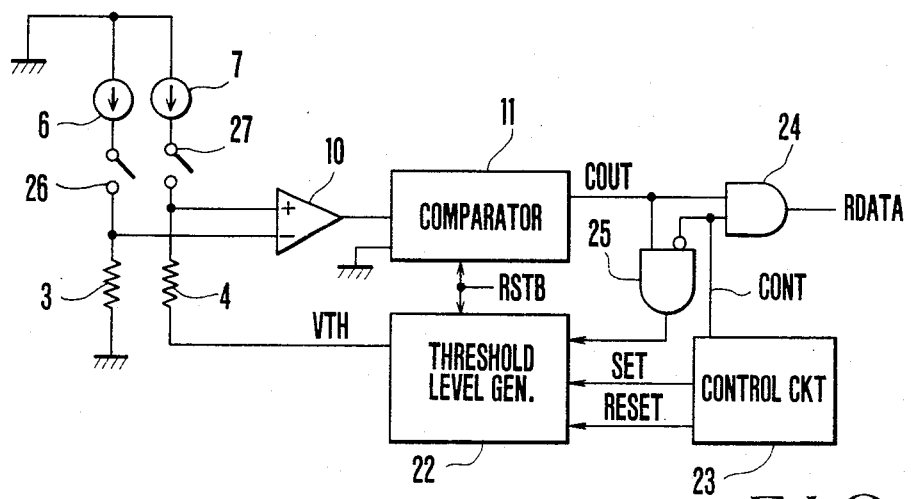
FIG. 6 is a block diagram of a second embodiment of the present invention in which the invention is applied to a pulse driven detector circuit.

A pulse driven detector circuit according to a second embodiment of the present invention will be described with reference to FIG. 6. Switching circuits 26 and 27 are inserted between a constant current source 6 and a sensing line 3 and between a constant current source 7 and a sensing line 4, respectively. A current pulse on the sensing line is thus conditioned to have a pulse width of several of hundreds of nsec to several sec. According to this pulse driven scheme, the current duty of the sensing line can be decreased, and heat dissipation thereof can be decreased. This permits the detection of high output voltage. This effect is described in Japanese preliminary patent publication No. 48-13039 and in AIP Conference Proceedings No. 24, p. 547, "Some Aspects of Permalloy Chevron Strip Detector". In the detector circuit shown in FIG. 6, pulse voltages of several volts to 10 volts appearing on the sensing lines 3 and 4 must be suppressed to derive detection outputs of several millivolts superposed on these pulse voltages. Where the resistance of each of the sensing lines 3 and 4 has unevenness of 600±1.0Ω, a maximum amplitude difference between the detection output voltages on the sensing lines 3 and 4 under the application of 10 mA detection pulse current is as large as 200 mV. With this voltage difference, the differential amplifier 10 will be saturated with the result that the output signal cannot be detected. In order to avoid this problem, as shown in FIG. 6, the sensing line 4 is connected with the threshold voltage output VTH of a threshold level voltage generator 22 so that the aforementioned amplitude difference can be corrected. The operation of the circuit of the second embodiment is substantially the same as that of the circuit of the first embodiment shown in FIG. 4, and the sequence shown in FIG. 5 can generally be applied to the second embodiment.

In particular, it is assumed that one pulse voltage appearing on the sensing line 4 connected to a non-inverting input of the differential amplifier 10 has a lower amplitude than that of the other pulse voltage on the sensing line 3 connected to an inverting input. Under this condition, no output is produced from the differential amplifier 10. Then, during the threshold setting period, the amplitude of the one pulse is raised by the output VTH of the generator 22 toward the amplitude of the other pulse until both the amplitudes become coincident with each other. At this time, the difference between the detection signals superposed on the pulse voltages can be detected by the differential amplifier 10, and applied to one input of a comparator 11 having the other input grounded.

In summary, according to the present invention, the threshold level voltage generator is controlled in response to the output signal from a circuit for determining the level ("1" or "0") of the detection signal during the period in which the read signal of "0" is generated, thereby optimizing the threshold level voltage. As a result, a bubble memory detector circuit can be provided wherein the threshold level need not be adjusted, and a threshold level margin can be widened.

The present invention is not limited to the particular embodiment described. Various changes and modifications may be made within the spirit and scope of the present invention. For example, the present invention may be applied to any type of signal processing circuit which generates a read signal of level "0" before the data read operation.

What is claimed is:

1. A signal processing circuit for a magnetic bubble memory device having two bubble sensing elements, comprising:
    a differential amplifier, connected to said two bubble sensing elements, for amplifying a difference between output signals from said two bubble sensing elements;
    a comparator, connected to said differential amplifier, for comparing an output signal from said differential amplifier with a given reference level; and
    reference level determining means, connected to said comparator, for changing the reference level during a period in which absence of a bubble is detected by the bubble sensing elements until the output of the comparator changes at a first reference level and for determining a second reference level for bubble read operation on the basis of the first reference level.

2. A signal processing circuit according to claim 1 wherein said reference level determining means comprises a threshold level generator and a control circuit, said control circuit supplying a control signal which determines said period to a gate, a reset pulse to said threshold level generator at the initiation of said period to determine an initial value of said reference level and a set signal to said threshold level generator when the first reference level is reached so as to determine the second reference level, and said threshold level generator being responsive to the output signal of said comparator through the gate to change the reference level during said period.

3. A signal processing circuit for a magnetic bubble memory device having two pulse bubble driven type sensing elements, comprising:
    pulse current drive means connected to said sensing elements;
    a differential amplifier, connected to said two bubble sensing elements, for amplifying a difference between output signals from said two bubble sensing elements;
    a comparator, connected to said differential amplifier, for comparing an output signal from said differential amplifier with a predetermined level; and
    reference level for determining means, connected to said comparator, for producing a reference level supplied to one of said sensing elements and changing the reference level during a period in which absence of a bubble is detected by the bubble sensing elements until the output of the comparator changes at a first reference level and for determining a second level for bubble read operation on the basis of the first reference level.

* * * * *

UNITED STATES PATENT AND TRADEMARK OFFICE
CERTIFICATE OF CORRECTION

PATENT NO. : 4,538,242

DATED : August 27, 1985

INVENTOR(S) : Takashi Toyooka, et al.

It is certified that error appears in the above-identified patent and that said Letters Patent is hereby corrected as shown below:

In the legend, [73], insert the name of the assignee --Hitachi, Ltd., Tokyo, Japan --.

Col. 2, l. 26: change "processig" to --processing--

Col. 4, l. 19: change "generted" to --generated--

Col. 4, l. 57: change "sec" to --msec--

Col. 4, l. 59: change "dissiption" to --dissipation--

Col. 5, l. 46: change "embodiment" to --embodiments--

Signed and Sealed this

First Day of April 1986

[SEAL]

Attest:

DONALD J. QUIGG

Attesting Officer

Commissioner of Patents and Trademarks